United States Patent [19]

Imai

[11] Patent Number: 5,494,836
[45] Date of Patent: Feb. 27, 1996

[54] PROCESS OF PRODUCING HETEROJUNCTION BIPOLAR TRANSISTOR WITH SILICON-GERMANIUM BASE

[75] Inventor: Kiyotaka Imai, Tokyo, Japan

[73] Assignee: NEC Corporation, Tokyo, Japan

[21] Appl. No.: 460,259

[22] Filed: Jun. 2, 1995

Related U.S. Application Data

[62] Division of Ser. No. 223,500, Apr. 5, 1994.

[30] Foreign Application Priority Data

Apr. 5, 1993 [JP] Japan ..................... 5-077298

[51] Int. Cl.$^6$ .................................. H01L 21/265
[52] U.S. Cl. .................. 437/31; 437/89; 437/90; 437/106; 437/128; 437/99; 437/131; 148/DIG. 10; 148/DIG. 11; 148/DIG. 68; 148/DIG. 69; 148/DIG. 72; 257/197; 257/198; 257/591; 257/592; 257/593
[58] Field of Search .................. 437/31, 89, 90, 437/106, 128, 131, 99; 148/DIG. 10, DIG. 11, DIG. 68, DIG.69, DIG. 72; 257/197, 198, 592, 591, 593

[56] References Cited

U.S. PATENT DOCUMENTS

| | | |
|---|---|---|
| 4,780,427 | 10/1988 | Sakai et al. . |
| 4,975,381 | 12/1990 | Taka et al. ................... 437/31 |
| 5,140,400 | 8/1992 | Morishita . |
| 5,177,583 | 1/1993 | Endo et al. . |
| 5,232,861 | 8/1993 | Miwa ........................ 437/31 |
| 5,272,095 | 12/1993 | Enquist et al. ............... 437/31 |
| 5,296,391 | 3/1994 | Sato et al. ................... 437/31 |
| 5,321,301 | 6/1994 | Sato et al. . |
| 5,346,840 | 9/1994 | Fujioka ...................... 437/31 |
| 5,389,803 | 2/1995 | Mohammad . |
| 5,391,503 | 2/1995 | Miwa et al. ................... 437/31 |
| 5,399,511 | 3/1995 | Taka et al. ................... 437/31 |
| 5,424,227 | 6/1995 | Dietrich et al. .............. 437/131 |
| 5,424,228 | 6/1995 | Imai ......................... 437/31 |
| 5,432,104 | 7/1995 | Sato ......................... 437/31 |

FOREIGN PATENT DOCUMENTS

| | | |
|---|---|---|
| 4330730 | 11/1992 | Japan . |
| 4322432 | 11/1992 | Japan . |

OTHER PUBLICATIONS

"Epitaxial-Base Double-Poly Self-Aligned Bipolar Transistors," by E. Ganin et al., IEEE IEDM Technical Digest, 1990, pp. 603–606.

"Low Temperature Operation of Si and SiGe Bipolar Transistors," by E. F. Crabbé et al., IEEE IEDM Technical Digest, 1990, pp. 17–20.

"SiGe–Base Heterojunction Bipolar Transistors: Physics and Design Issues," by G. L. Patton et al., IEEE IEDM Technical Digest, 1990, pp. 13–16.

"A 'Self–Aligned' Selective MBE Technology for High–Performance Bipolar Transistors," by F. Sato et al., IEEE IEDM Technical Digest, 1990, pp. 607–610.

*Primary Examiner*—George Fourson
*Assistant Examiner*—Long Pham
*Attorney, Agent, or Firm*—Popham, Haik, Schnobrich & Kaufman, Ltd.

[57] ABSTRACT

The invention provides a heterojunction bipolar transistor which has a low resistance SiGe base and is high in current gain and cutoff frequency even at low temperatures near the liquid nitrogen temperature. The transistor fabrication process comprises forming an n-type collector layer on a silicon substrate and a dielectric film on the collector layer, forming a base electrode of p$^+$-type polysilicon having an opening on the dielectric film, isotropically etching the dielectric film on the collector layer by using the opening of the base electrode to form a window, forming an external base layer of p$^+$-type silicon on the collector layer exposed by the window, selectively etching the external base layer to form an aperture in a central region, forming a p-type SiGe intrinsic base layer in the aperture of the external base layer and then forming an n$^+$-type emitter on the intrinsic base layer.

10 Claims, 4 Drawing Sheets

PROCESS OF PRODUCING HETEROJUNCTION BIPOLAR TRANSISTOR WITH SILICON-GERMANIUM BASE

This is a divisional of U.S. patent application Ser. No. 08/223,500, filed Apr. 5, 1994.

BACKGROUND OF THE INVENTION

This invention relates to an improved heterojunction bipolar transistor having a silicon-germanium base and a process of producing the transistor.

Recently interesting reports have been published about heterojunction bipolar transistors in which the emitter is formed of silicon and the base of a silicon-germanium alloy (herein expressed simply as SiGe) which is narrower in bandgap than silicon: e.g., IEEE IEDM Technical Digest (1990), pp. 17–20 and IEEE IEDM Technical Digest (1990), pp. 13–16. The use of SiGe for the base can enhance the efficiency of carrier injection from the emitter into the base, and in consequence current gain becomes sufficiently high even though the impurity concentration in the SiGe base is made higher than that in the conventional base silicon base by more than one order of magnitude. With a SiGe base, high performance at high frequencies can be realized by sufficiently raising the doping level in the base and reducing the base width. Furthermore, there is a possibility of shortening the base transit time of the carrier and consequentially further enhancing the high-frequency characteristics by grading the germanium profile in the SiGe base.

When conventional silicon homojunction bipolar transistors are operated at low temperatures near the liquid nitrogen temperature, current gain decreases to about $\frac{1}{10}$ of that at room temperature. In contrast, heterojunction bipolar transistors having a SiGe base are very higher in emitter injection efficiency and current gain even at low temperatures and practically operatable at the liquid nitrogen temperature. Needless to mention, the important merit of the operation of semiconductor devices at the liquid nitrogen temperature is a great reduction in interconnection delay by reason of a decrease in interconnection resistance to $\frac{1}{5}$ to $\frac{1}{10}$ of that at room temperature. By incorporating SiGe base heterojunciton bipolar transistors in LSIs there is a good prospect of very high-speed operation of various circuits at low temperatures.

Meanwhile, much efforts have been devoted to the development of self-aligned bipolar transistors in which an emitter region and an external base region are formed in a self-aligned manner, with the intention of reducing the base capacitance and base resistance to thereby raise the operation speed of bipolar transistors. For example, new processes for the fabrication of self-aligned bipolar transistors having an epitaxially grown base layer are reported in IEEE IEDM (1990), pp. 603–606 and IEEE IEDM (1990), pp. 607–610. However, the application of these processes to the fabrication of a SiGe base heterojunction bipolar transistor is problematic for several reasons. It is difficult to suitably differentiate the doping level in an external base from that in an intrinsic base, and a high-temperature heat treatment employed for the formation of the emitter adversely affects the characteristics of the base. (The problems will be explained hereinafter more particularly by comparison with the present invention.)

SUMMARY OF THE INVENTION

It is an object of the invention to provide a heterojunction bipolar transistor which uses SiGe as the base material and is low in base resistance and high in current gain and cutoff frequency.

It is another object of the invention to provide a process of producing a heterojunction bipolar transistor according to the invention.

Essentially a heterojucntion bipolar transistor according to the invention comprises a collector layer which is formed of silicon or SiGe of first-type conductivity and formed on a principal surface of a semiconductor substrate, an intrinsic base layer which is formed of SiGe of opposite second conductivity and formed on the collector layer, an external base layer which is formed of silicon of the second-type conductivity and formed on the collector layer so as to contiguously surround the intrinsic base layer, and an emitter layer which is formed of silicon of the first-type conductivity and formed on the intrinsic base layer.

A process of prouducing a heterojunction bipolar transistor according to the invention comprises the steps of (i) forming a collector layer of silicon or SiGe of first-type conductivity on a principal surface of a semiconductor substrate, (ii) forming an external base layer of silicon of opposite second-type conductivity on the collector layer, (iii) selectively removing the external base layer so as to form an aperture in which the collector layer is exposed, (iv) forming an intrinsic base layer of SiGe of the second-type conductivity on the collector layer exposed in the aperture of the external base layer so as to become laterally contiguous to the external base layer, and (v) forming an emitter layer of silicon of the first-type conductivity on the intrinsic base layer.

Thus, in a heterojunction bipolar transistor according to the invention the external base is formed of silicon whereas the intrinsic base is formed of SiGe, and the external and intrinsic base layers are formed individually. Therefore, the amount of bandgap narrowing in the intrinsic base can be made larger than that in the external base, and the doping level in the external base can be made higher than that in the intrinsic base. In the fabrication process according to the invention no high-temperature heat treatment is needed. This heterojunction bipolar transistor is high in current gain and cutoff frequency even at low temperatures near the liquid nitrogen temperature since SiGe is used as the base material in an appropriate manner, and this transistor becomes a very high-speed transistor since the base resistance and the total base area can be reduced.

DESCRIPTION OF THE PREFERRED EMBODIMENTS

Figure 1A:
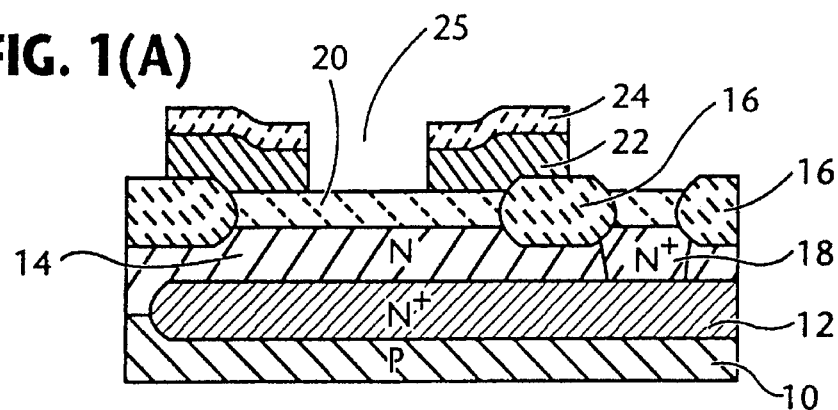
FIGS. 1(A) to 1(H) illustrate, in schematic cross-sectional views, a process of fabricating a heterojunction bipolar transistor embodying the present invention.
Figure 1B:
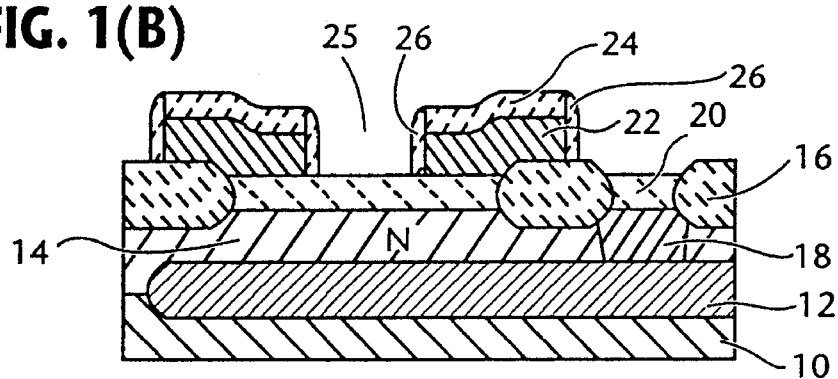
Figure 1C:
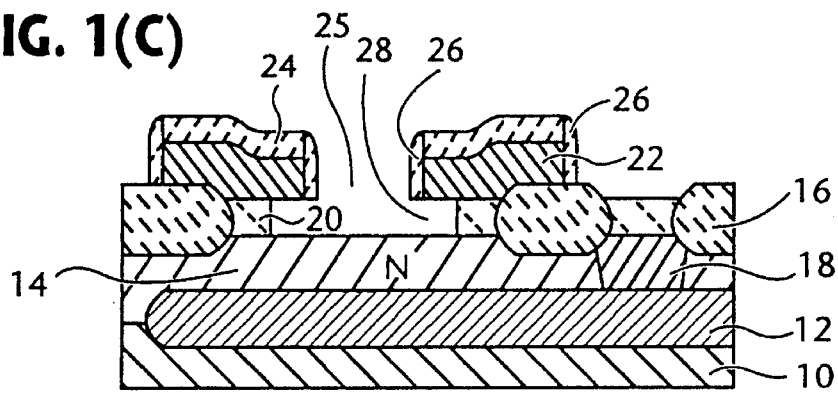
Figure 1D:
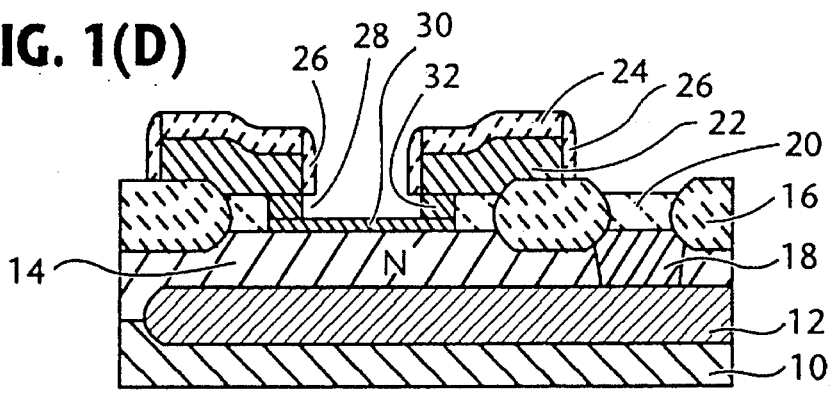
Figure 1E:
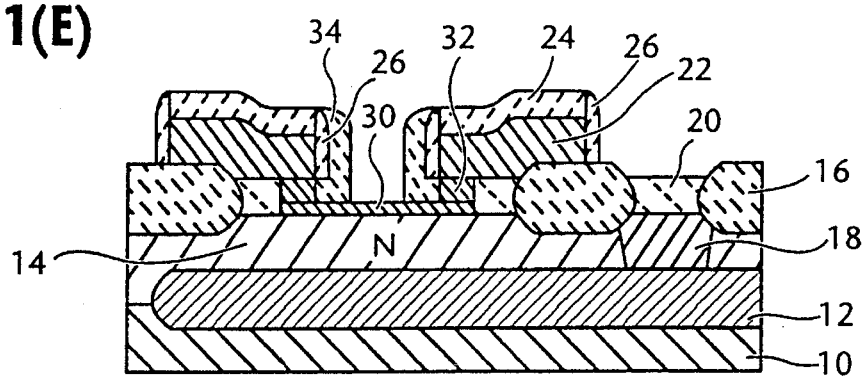
Figure 1F:
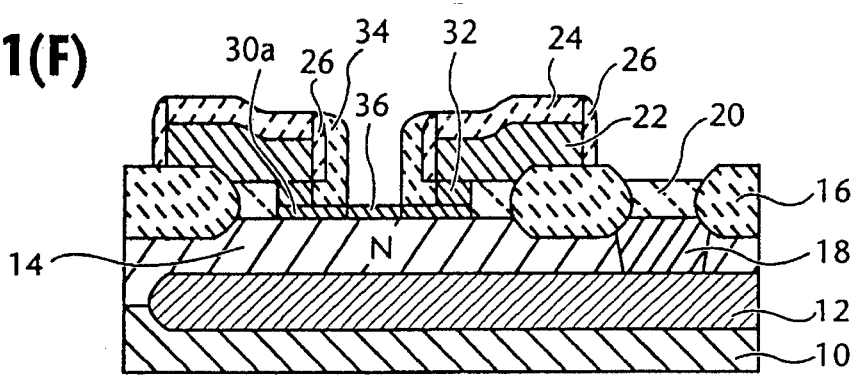
Figure 1G:
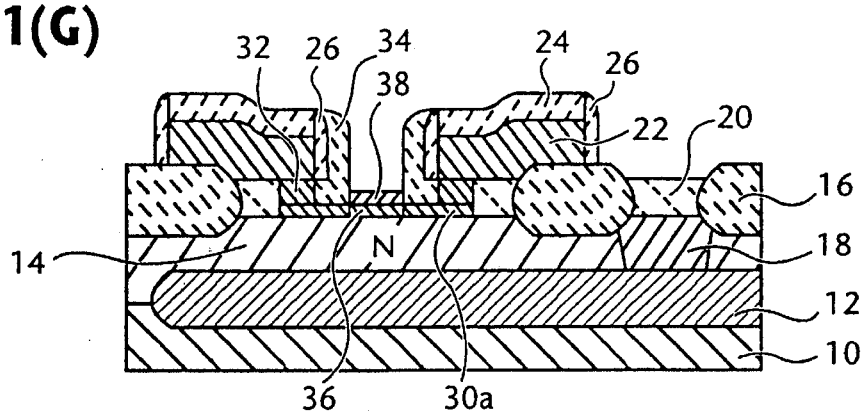
Figure 1H:
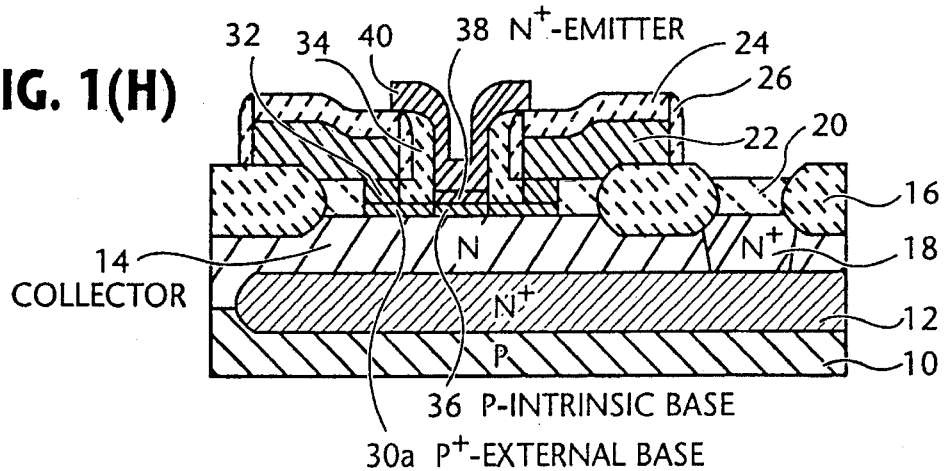

FIGS. 1(A) to 1(H) illustrate a process of fabricating a SiGe-base heterojunction bipolar transistor as an embodiment of the invention. The completed structure of the transistor is seen in FIG. 1(H).

Referring to FIG. 1(A), first an n$^+$-type buried layer 12 is formed on a p-type silicon substrate 10 and overlaid with an n-type silicon epitaxial layer 14 which serves as a collector layer, and a silicon oxide film 16 for separation of elements is formed on the collector layer 14 by a selective oxidation method. Then, using a resist mask (not shown) an n$^+$-type collector pull-up layer 18 is formed by ion implantation, and the resist is removed. Next, a silicon oxide film 20 having a thickness of 80–160 nm is formed on the collector and collector pull-up layers 14, 18, and a p$^+$-type polycrystalline silicon (hereafter, simply polysilicon) layer (22) having a thickness of 100–300 nm is formed on the oxide film 20 and overlaid with a silicon nitride film 24 having a thickness of 100–300 nm. Then the polysilicon layer 22 is patterned together with the nitride film 24 by a dry etching method using a resist mask (not shown) to thereby form a base electrode 20 of p$^+$-type polysilicon having an opening 25 in a central area, followed by the removal of the resist.

Referring to FIG. 1(B), a silicon nitride film is formed on the exposed surfaces of the intermediate shown in FIG. 1(A), and then anisotropic dry etching is made in order to leave a silicon nitride film 26 having a thickness of 50–200 nm on the outer side face of the base electrode 22 and the inner side face defining the opening 25. Herein this nitride film 26 is called the first sidewall.

Referring to FIG. 1(C), in the opening 25 the oxide film 20 is removed by isotropic wet etching to thereby form a window 28 in the oxide film 20. The etching operation is carried out to such an extent that the perimeter of the window 28 is indented from the perimeter of the opening 25 by 100–400 nm. As a result the base electrode layer 22 has an overhanging region around the opening 25, and the bottom face of this layer is exposed in the overhanging region. The perimeter of the window 28 can be controlled by controlling the etching rate and etching time, and the lateral depth of the window 28 from the perimeter of the opening 25 is uniform in every direction.

Referring to FIG. 1(D), on the surface of the n-type collector 14 exposed by the window 28 in the oxide film 20, a p$^+$-type silicon layer 30 with impurity concentration of $1 \times 10^{19}$ to $1 \times 10^{20}$ cm$^{-3}$ is formed by a selective epitaxial growth technique. In this example the thickness of the p$^+$-type silicon layer 30 is from about ⅓ to about ½ of the thickness of the oxide film 20, viz. from 30 to 100 nm. The growth of the p$^+$-type silicon layer 30 is spontaneously accompanied by the growth of p$^+$-type polysilicon 32 on the bottom face of the overhanging region of the p$^+$-type polysilicon electrode 22, and in consequence the electrode 22 is connected to the p$^+$-type silicon layer 30 by the p$^+$-type polysilicon film 32.

Referring to FIG. 1(E), a silicon oxide film (34) having a thickness of 50–200 nm is formed on the surfaces exposed in the opening 25, and anisotropic etching is made in order to leave that oxide film 34 on the first sidewall 26 and the side face of the p$^+$-type polysilicon film 32. Herein this oxide film 34 is called the second sidewall.

Referring to FIG. 1(F), using the second sidewall 34 as a mask, the p$^+$-type silicon layer 30 is etched at a sufficiently high selectivity ratio with respect to the n-type silicon collector layer 14 to thereby expose the surface of the n-type collector layer 14. Then, on the exposed surface of the n-type collector 14 a p-type SiGe layer 36 with impurity concentration of $1 \times 10^{18}$ to $1 \times 10^{19}$ cm$^{-3}$ is formed by a selective epitaxial growth technique. In the p-type SiGe layer 36 the content of Ge is from about 5% to about 30% by weight, preferably from 10 to 15%, and in this example the thickness of this layer 36 is 20–80 nm. This p-type SiGe layer 36 serves as an intrinsic base. Under the second sidewall 34 and the p$^+$-type polysilicon film 32, the p$^+$-type silicon layer 30 remains as indicated at 30a in FIG. 1(F). The remaining p$^+$-type silicon layer 30a serves as an external base, and the p-type intrinsic base layer 36 connects at its side face to this exernal base 30a. As described above, the impurity concentration in the p-type intrinsic base 36 is lower than that in the external base 30a (p$^+$-type silicon layer 30). The p$^+$-type polysilicon film 32 between the external base 30a and the base electrode 22 serves as a subsidiary external base.

Referring to FIG. 1(G), as an emitter layer, an n$^+$-type silicon layer 38 is formed on the p-type intrinsic base 36 by a selective epitaxial growth technique.

Referring to FIG. 1(H), an emitter electrode 40 of n$^+$-type polysilicon is formed on the n$^+$-type emitter 38.

In this embodiment the collector layer 14 is a silicon layer, but it is optional to alternatively employ a SiGe layer as the collector layer.

In this embodiment, as shown in FIGS. 1(F) to 1(H), the p-type SiGe intrinsic base layer 36 has nearly the same thickness as the p$^+$-type silicon external base 30a.

Figure 2:
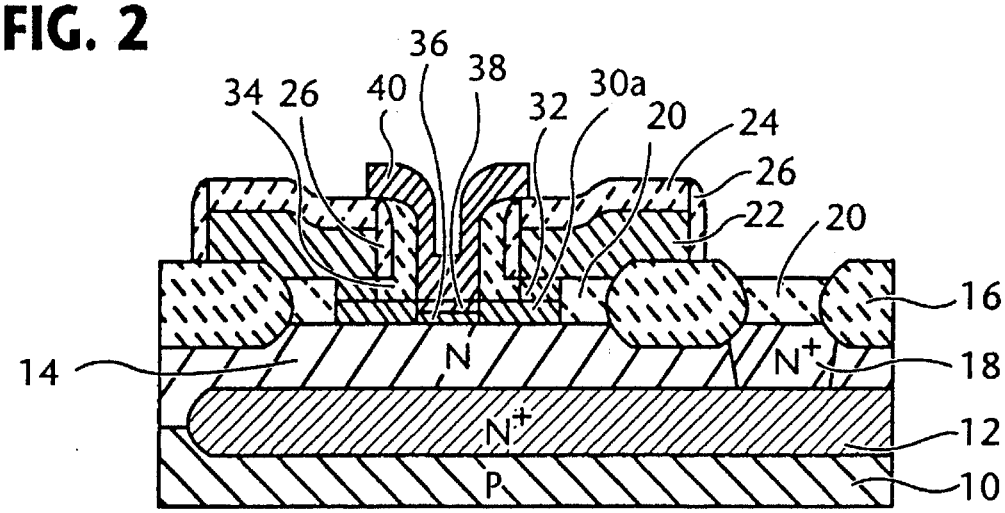
FIG. 2 shows a modification of the embodiment shown in FIG. 1(H) in respect of the thickness of the intrinsic base layer.

As shown in FIG. 2, the p-type intrinsic base layer 36 can be made thinner than the p$^+$-type external base layer 30a for the purpose of enhancing the high-frequency characteristics of the bipolar transistor by narrowing the base width.

As will be apparent from the foregoing description, an inherent advantage of the bipolar transistor structure and the fabrication process according to the invention is that the p$^+$-silicon external base 30a is self-aligned with the n$^+$-type emitter 38 and can be made very small in area. Therefore, it is possible to obtain a very high-speed bipolar transistor.

Figure 5:
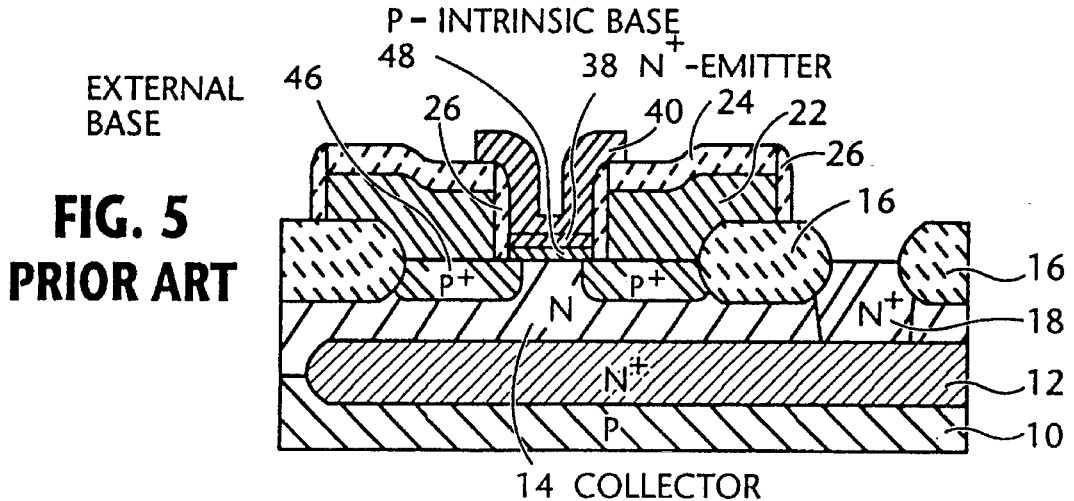
FIGS. 5 to 7 are schematic cross-sectional views of three types of earlier proposed bipolar transistor structures, respectively.

For comparison, FIG. 5 shows a bipolar transistor structure described in IEEE, IEDM Technical Digest (1990), pp. 603–606. On a p-type silicon substrate 10 formed with an n-type buried layer 12 there is a collector layer 14 of n-type silicon, and the collector region is surrounded by a separating oxide film 16. A base electrode 22 of p$^+$-type polysilicon covered with an oxide film 24 is formed on the collector 14 and patterned to form an emitter opening, and a side wall (oxide film) 26 is formed on each side face of the patterned electrode 22. By diffusion of impurity from the p$^+$-type polysilicon electrode 22 a p$^+$-type external base 46 is formed in a surface region of the collector layer 14 beneath the electrode 22. Next, a p-type intrinsic base layer 48 of silicon (or SiGe) is formed on the collector surface exposed in the emitter opening by a low temperature epitaxial growth technique. Next, an emitter electrode 40 of n$^+$-type polysilicon is formed on the intrinsic base 48 and annealed in order to form an n$^+$-type emitter 38 by diffusion of the dopant.

In this transistor construction the widths of the p$^+$-type external base 46 are determined by the positional relations between the separating oxide film 16, p$^+$-type polysilicon electrode 22 and the emitter opening in the electrode 22. In designing this transistor the contact area between the electrode 22 and the collector layer 14 must be made excessively large in order to secure an alignment margin at the stage of applying a resist for forming the opening in the electrode 22, because in case of misalignment the base resistance abnormally increases on one side of the opening, resulting in degradation of the transistor characteristics. Therefore, the base area becomes unnecessarily large and hence the base capacitance increases as a hindrance to the enhancement of the transistor operation speed.

Figure 6:
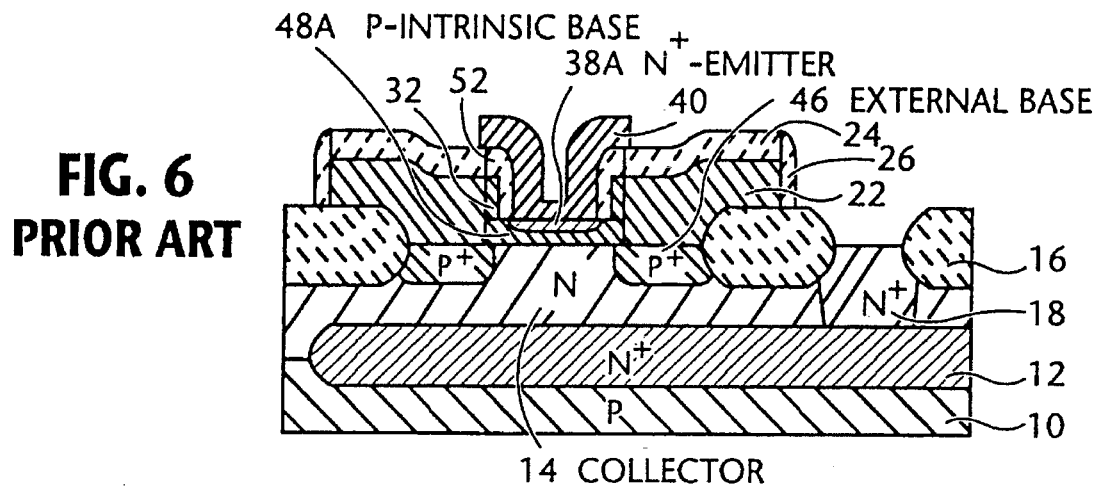

The same reference proposes another base-emitter construction, which is shown in FIG. 6. In this case, next to the formation of the emitter opening in the p$^+$-type polysilicon electrode 22, a p-type intrinsic base 48A of silicon (or SiGe) is formed on the exposed surface of the n-type collector 14 by a low temperature epitaxial growth technique, accompanied by the deposition of p-type polysilicon 32 on the exposed side face of the p$^+$-type polysilicon electrode 22. Then an oxide sidewall 52 is formed. Next, an emitter electrode 40 of n$^+$-type polysilicon is formed on the intrinsic base 48A and annealed in order to form an n$^+$-type emitter 38A by diffusion of the dopant from the emitter electrode 40. In this case too a p$^+$-type external base 46 is formed beneath the p$^+$-type polysilicon electrode 22 by diffusion of impurity from the electrode 22 during the heat treatment for forming the emitter 38A, and therefore the base capacitance increases. The bipolar transistor of either FIG. 5 or FIG. 6 may have a heterojunction by using p-type SiGe for the intrinsic base 48 or 48A instead of p-type silicon, but even if the heterojunction is employed it is difficult to effectively enhance the operation speed by reason of a high base capacitance.

Figure 7:
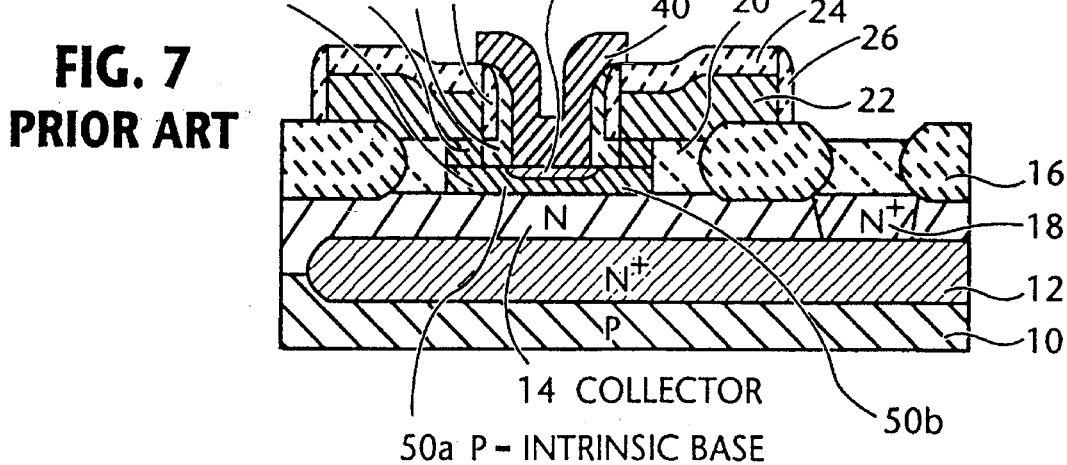

IEEE, IEDM Technical Digest (1990), pp. 607–610 proposes a different process of fabricating a self-aligned bipolar transistor having a silicon base. The result of the proposed process is illustrated in FIG. 7. An initial part of the process is similar to the steps illustrated in FIGS. 1(A) to 1(C) of the present invention. In the window in the oxide film 20, an intrinsic base layer 50 of p-type silicon is formed on the exposed collector surface by a selective epitaxial growth technique. During the formation of the intrinsic base layer 50, p$^+$-type polysilicon 32 deposits on the exposed bottom face of the p$^+$-type polysilicon electrode 22 so that the intrinsic base layer 50 is connected with the electrode 22 by the deposited p$^+$-type polysilicon 22. Then a second dielectic sidewall 34 is formed. After that an emitter electrode 40 of n$^+$-type polysilicon is formed, and a heat treatment is made in order to diffuse the dopant from the n$^+$-type emitter electrode 40 into a surface region of the base layer 50 beneath the emitter electrode 40 to thereby form an n$^+$-type emitter 38A.

In the construction shown in FIG. 7 the p$^+$-type polysilicon electrode 22 is spontaneously connected with the p-type intrinsic base 50 by p$^+$-type polysilicon 32. Therefore, there is no need for an alignment margin mentioned with respect to FIG. 5, and hence the base area can be reduced. However, if the bipolar transistor of FIG. 7 is modified to a heterojunction bipolar transistor by using SiGe for the intrinsic base layer 50 there arises a problem which is explained below.

When the intrinsic base layer 50 in FIG. 7 is a p-type SiGe layer, the connecting part 32 between the intrinsic base layer 50 and the base electrode 22 is p-type polycrystalline SiGe (poly-SiGe). Before forming the emitter electrode 40 there is no difference in impurity concentration between the p-type SiGe intrinsic base layer 50 and the p-type poly-SiGe 32. The heat treatment of the emitter electrode 40 to form the n$^+$-type emitter 38A causes diffusion of impurity from the p$^+$-type polysilicon electrode 22 into the p-type poly-SiGe 32 so that the resistance of the p-type poly-SiGe lowers. However, the resistance of the p-type SiGe base layer 50 does not lower since the diffusion of impurity does not reach this layer 50.

It is conceivable to lower the resistance of both p-type poly-SiGe 32 and the p-type SiGe base layer 50 by performing a heat treatment before forming the emitter electrode 40 to accomplish deep diffusion of impurity from the p$^+$-type polysilicon electrode 22. However, such a heat treatment is liable to cause an undesirable change in the impurity profile of the p-type SiGe layer 50 and consequential degradation of the transistor characteristics. Besides, it is likely that crystal defects appear at the interface between the p-type SiGe base layer 50 and the n-type collector layer 14 as a cause of current leakage between the base and the collector.

There is a possibility of using an arc lamp annealing technique for increasing the impurity concentration in both the p-type poly-SiGe 32 and the p-type SiGe base layer 50 without suffering from the above described disadvantages. However, the annealing treatment results in lowering of current gain and cutoff frequency for the following reasons.

In general, bandgap narrowing occurs when a semiconductor crystal is heavily doped. When the doping level in the p-type SiGe base layer 50 and the p-type poly-SiGe 32 is enhanced by diffusion of impurity from the p$^+$-type polysilicon electrode 22 it is inevitable that the p-type poly-SiGe 32 and a peripheral region 50b of the p-type SiGe layer 50 become higher in doping level and narrower in bandgap than a central region 50a of the SiGe layer 50 right beneath the emitter 38A. Then, most of the current flowing in a peripheral region of the n$^+$-type emitter 38A flows into the base electrode 22 of p$^+$-type polysilicon and/or the n-type collector 14 through the heavily doped peripheral region 50b of the base layer 50. This is because the peripheral region 50b having a narrower bandgap is higher in carrier injection efficiency than the central region 50a. As a result, the current gain of the transistor decreases. The cutoff frequency also lowers because current takes a roundabout way in passing across the base layer 50. Particularly in the case of large current operation the lateral flow of current from a peripheral region of the emitter augments by reason of a so-called emitter clouding phenomenon, i.e. current concentration in a peripheral region of the emitter, to result in further lowering of current gain and cutoff frequency.

In the present invention SiGe is used for the intrinsic base 36 and Si for the external base 30a, and the intrinsic base 36 is formed after the formation of the external base 30a. Therefore, the amount of bandgap narrowing of p$^+$-type SiGe of the intrinsic base 36 can be made larger than that of p$^+$-type silicon of the external base 30a by controlling the Ge content in the SiGe. That is, the intrinsic base 36 can be made higher in carrier injection efficiency than the external base. As a result, electrons from the n$^+$-type emitter 38 more readily flow into the p-type intrinsic base 36 than into the p$^+$-type external base 30a. By virtue of a great decrease in the flow of electrons into the external base 30a, current gain and cutoff frequency do not lower at large current operation of the transistor. This effect is particularly significant at low temperatures near the liquid nitrogen temperature, because at such low temperatures the tendency of electrons to flow into the p-type intrinsic base 36 (in which the amount of bandgap narrowing is larger) becomes stronger than at room temperature.

Furthermore, according to the invention the external base 30a can be made sufficiently high in doping level and low in resistance without making high-temperature heat treatment. In the case of using SiGe for the base 50 in the earlier proposed bipolar transistor shown in FIG. 7 a high-temperature heat treatment is needed to lower the resistance of the external base 32, 50b by diffusion of impurity, but the heat treatment adversely affects the crystal structure and impurity profile of the SiGe layer 50 as explained hereinbefore. This problem is obviated in the present invention since the external base 30a and the intrinsic base 36 are formed individually without relying on diffusion of impurity from a precedingly formed part.

Figure 3:
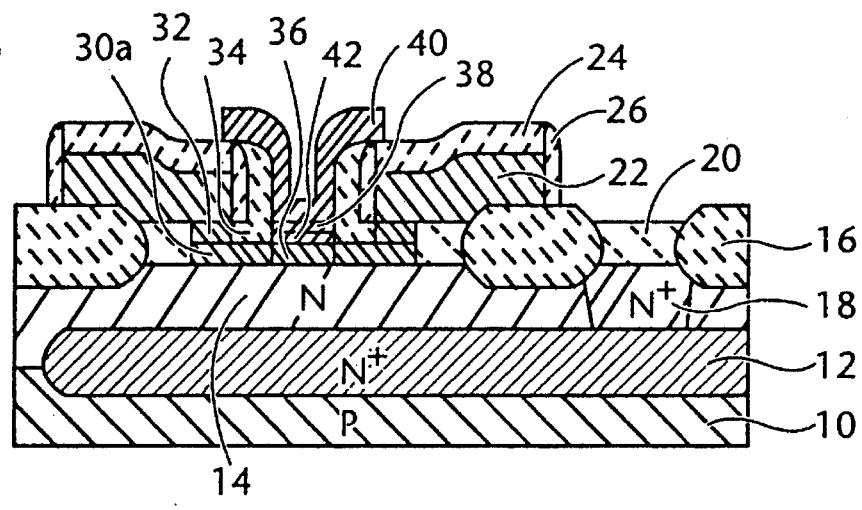
FIG. 3 shows a modification of the embodiment shown in FIG. 1(H) in respect of the construction of the emitter.

FIG. 3 shows another modification of the heterojunction bipolar transistor of FIG. 1(H). In this case the emitter of the bipolar transistor consists of two layers 38 and 42 which are different in carrier concentration. First a buffer emitter layer 42 of n-type silicon is formed on the p-type intrinsic base 36 by a selective epitaxial growth technique. The buffer emitter layer 42 is $3\times10^{18}$ to $3\times10^{19}$ cm$^{-3}$ in carrier concentration and 10–50 nm in thickness. Then the buffer emitter layer 42 is overlaid with an n$^+$-type silicon emitter layer 38 which is $1\times10^{20}$ to $3\times10^{21}$ cm$^{-3}$ in carrier concentration.

The insertion of the buffer emitter layer 42 brings about a rise in breakdown voltage between emitter and base because the n$^+$-type emitter layer 38 is prevented from making direct contact with the p$^+$-type external base 30a which is relatively high in doping level. For example, when the doping levels of the p$^+$-type external base 30a and the n$^+$-type emitter layer 38 are $8\times10^{18}$ cm$^{-3}$ and $1\times10^{21}$ cm$^{-3}$ respectively the emitter-base breakdown voltage becomes about 2.0 V in the absence of the buffer emitter layer 42, but by the insertion of the buffer emitter layer 42 with doping level of $5\times10^{18}$ cm$^{-3}$ the emitter-base breakdown voltage rises to about 4 V. In view of the fact that in Bi-CMOS gate circuites the bipolar transistor is sometimes reverse biased, a rise in the emitter-base breakdown voltage leads to an improvement in reliability.

Furthermore, the insertion of the buffer emitter layer 42 has the effect of suppressing lowering of current gain at low temperatures near the liquid nitrogen temperature. When the n$^+$-type emitter layer 38 is in direct contact with the relatively heavily doped p-type intrinsic base 36 a reduction in current gain occurs at low temperatures because of an increase in base current leakage attributed to emitter-base tunneling current. By the insertion of the buffer emitter layer 42 the tunneling current decreases so that the base current leakage is small even at the liquid nitrogen temperature and, besides, the junction capacitance between emitter and base decreases.

Figure 4:
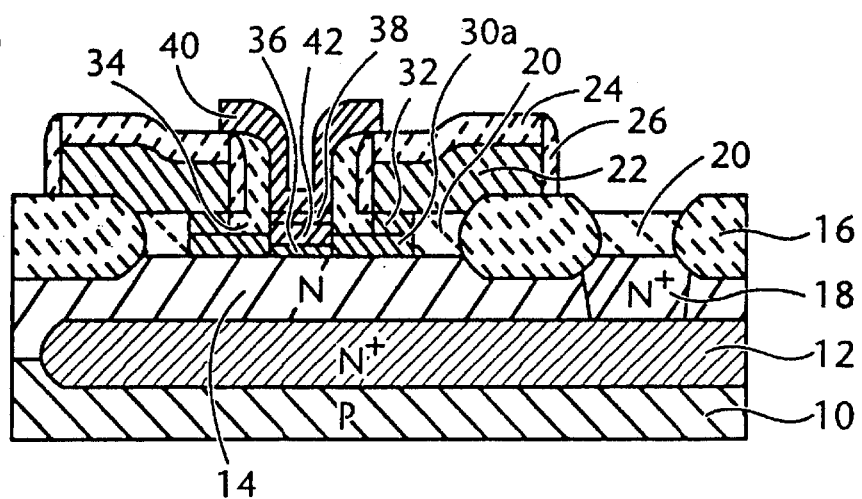
FIG. 4 shows a modification of the transistor of FIG. 3 in respect of the thickness of the intrinsic base layer.

In the transistor of FIG. 3 the p-type intrinsic base 36 may be made thinner than the p$^+$-type external base 30a, as shown in FIG. 4, to thereby enhance high-frequency characteristics of the transistor.

What is claimed is:

1. A process of producing a heterojunction bipolar transistor, comprising the steps of:
   (i) forming a collector layer on a principal surface of a semiconductor substrate, the collector layer being formed of a semiconductor selected from the group consisting of silicon and silicon-germanium of first-type conductivity;
   (ii) forming an external base layer of silicon of an opposite second-type conductivity on the collector layer;
   (iii) selectively removing the external base layer so as to form an aperture in which the collector layer is exposed;
   (iv) forming an intrinsic base layer of silicon-germanium of the second-type conductivity on the collector layer exposed in said aperture of the external base layer so as to become laterally contiguous to the external base layer; and
   (v) forming an emitter layer of silicon of the first-type conductivity on the intrinsic base layer.

2. A process according to claim 1, wherein the dopant concentration in the external base layer is made higher than the dopant concentration in the intrinsic base layer.

3. A process according to claim 1, wherein the intrinsic base layer is made thinner than the external base layer.

4. A process according to claim 1, wherein the step (v) comprises the sub-steps of forming a first layer which is relatively low in dopant concentration directly on the intrinsic base layer and forming a second layer which is higher in dopant concentration than said first layer on said first layer.

5. A process of producing a heterojunction bipolar transistor, comprising the steps of:
   (a) forming a collector layer of silicon of a first-type conductivity on a principal surface of a semiconductor substrate;
   (b) forming a first dielectric film on the collector layer;
   (c) forming a layer of polycrystalline silicon of a second-type conductivity on the first dielectric layer and a second dielectric film on the polycrystalline silicon layer;
   (d) selectively etching said polycrystalline silicon layer together with the second dielectric film to thereby form a base electrode having an opening wherein the first dielectric film is exposed;
   (e) forming a third dielectric film on the base electrode and the exposed region of the first dielectric film and selectively etching the third dielectric film so as to leave the third dielectric film as a first sidewall on the base electrode side face defining said opening;
   (f) selectively and isotropically etching the first dielectric film by using said opening of the base electrode to thereby form a window such that the base electrode overhangs said window in a region around said opening;
   (g) forming an external base layer of silicon of the second-type conductivity on the collector layer exposed in said window in the first dielectric film by a selective epitaxial growth technique and thereby simulataneously depositing polycrystalline silicon of the second-type conductivity on the bottom face of the overhanging region of the base electrode until the deposited polycrystalline silicon connects to the external base layer to serve as a subsidiary external base;
   (h) forming a fourth dielectric film on the base electrode and the external base layer and selectively etching the fourth dielectric film so as to leave the fourth dielectric film as a second sidewall on the first sidewall and a side face of the subsidiary external base;
   (i) selectively etching the external base layer by using the second sidewall as mask so as to form an aperture which is in alignment with the opening of the base electrode;
   (j) forming an intrinsic base layer of silicon-germanium of the second-type conductivity on the collector layer exposed by said aperture of the external base layer such that the intrinsic base layer becomes laterally contiguous to the external base layer; and
   (h) forming an emitter layer of silicon of the first-type conductivity on the intrinsic base layer.

6. A process according to claim 5, further comprising the step of forming an emitter electrode of polycrystalline silicon of the first-type conductivity on the emitter layer such that the emitter electrode is separated from the base electrode and the subsidiary external base by the second sidewall.

7. A process according to claim 5, wherein the dopant concentration in the external base layer is made higher than the dopant concentration in the intrinsic base layer.

8. A process according to claim 5, wherein the intrinsic base layer is made thinner than the external base layer.

9. A process according to claim 5, wherein the step (h) comprises the sub-steps of forming a first layer which is relatively low in dopant concentration directly on the intrinsic base layer and forming a second layer which is higher in dopant concentration than said first layer on said first layer.

10. A process according to claim 5, wherein the first and fourth dielectric films are formed of silicon oxide and the second and third dielectric films are formed of silicon nitride.

* * * * *